(12) United States Patent
Tobita

(10) Patent No.: US 7,362,318 B2
(45) Date of Patent: Apr. 22, 2008

(54) DISPLAY APPARATUS PROVIDED WITH DECODE CIRCUIT FOR GRAY-SCALE EXPRESSION

(75) Inventor: Youichi Tobita, Hyogo (JP)

(73) Assignee: Mitsubishi Denki Kabushiki Kaisha, Chiyoda-Ku (JP)

(*) Notice: Subject to any disclaimer, the term of this patent is extended or adjusted under 35 U.S.C. 154(b) by 681 days.

(21) Appl. No.: 10/899,000

(22) Filed: Jul. 27, 2004

(65) Prior Publication Data
US 2005/0046646 A1    Mar. 3, 2005

(30) Foreign Application Priority Data
Sep. 3, 2003   (JP)   ............. 2003-311326

(51) Int. Cl.
  *G09G 5/00*   (2006.01)
  *G09G 5/10*   (2006.01)
(52) U.S. Cl. .................... 345/204; 345/100
(58) Field of Classification Search ............... 345/98, 345/100, 204
See application file for complete search history.

(56) References Cited

U.S. PATENT DOCUMENTS

| | | | |
|---|---|---|---|
| 5,726,676 A * | 3/1998 | Callahan et al. | 345/98 |
| 6,275,061 B1 * | 8/2001 | Tomita | 324/770 |
| 6,417,827 B1 | 7/2002 | Nagao et al. | |
| 6,476,785 B1 | 11/2002 | Pathak et al. | |
| 6,518,946 B2 * | 2/2003 | Ode et al. | 345/98 |
| 6,518,964 B1 * | 2/2003 | Suits et al. | 345/419 |
| 6,806,859 B1 * | 10/2004 | Kanoh et al. | 345/98 |
| 6,897,841 B2 * | 5/2005 | Ino | 345/87 |
| 2002/0027551 A1 * | 3/2002 | Nitta et al. | 345/204 |
| 2002/0047839 A1 | 4/2002 | Kasai | |
| 2003/0184534 A1 * | 10/2003 | Ogawa et al. | 345/204 |

FOREIGN PATENT DOCUMENTS

| | | |
|---|---|---|
| JP | 9-325320 | 12/1997 |
| JP | 2000-163018 | 6/2000 |
| JP | 2001-34234 | 2/2001 |
| KR | 10-2001-0019208 | 3/2001 |

OTHER PUBLICATIONS

Chinese Office Action issued in Chinese Patent Application No. 2004-100686934, dated Apr. 27, 2007.

* cited by examiner

*Primary Examiner*—Amare Mengistu
*Assistant Examiner*—Afroza Y Chowdhury
(74) *Attorney, Agent, or Firm*—McDermott Will & Emery LLP

(57) ABSTRACT

The decode circuit includes decode paths corresponding to gray-scale voltages. Each decode path has decode transistors connected serially and corresponding to display signal bits. In a selected decode path, the decode transistors connected serially are all turned on to transmit the corresponding gray-scale voltage to output node of the decode circuit. The gate of each of the decode transistors is connected to one signal line of first and second signal lines transmitting the corresponding display signal bits and inverted signals of the corresponding display signal bits, respectively. The other signal line not connected to the gate is disposed so as to create a parasitic capacitance similar to a gate capacitance between a node connected to the source or drain of the decode transistor and the other signal line. Accordingly, noise resistance in the decode circuit for gray-scale expression can be enhanced with suppressing increase in circuit area.

12 Claims, 7 Drawing Sheets

DISPLAY APPARATUS PROVIDED WITH DECODE CIRCUIT FOR GRAY-SCALE EXPRESSION

BACKGROUND OF THE INVENTION

1. Field of the Invention

The present invention relates to a display apparatus for characters, pictures and others and, more particularly, to a display apparatus capable of presenting a gray-scale expression based on a digital signal.

2. Description of the Background Art

Display apparatuses having liquid crystal elements or electroluminescence (EL) elements as display pixels have been employed as display panels of a personal computer, a television receiver, a portable telephone, a portable information terminal and others. Such display apparatuses have greater merits in respects of lower power consumption and smaller size and weight as compared with those of conventional types.

An pixel including a liquid crystal element or an EL element alters a display brightness thereof according to a level of an applied voltage (a voltage applied to an pixel will be also referred to as "display voltage"). Therefore, in such pixels, display voltages are set with a series of levels in a gradual manner so as to be adaptable for intermediate brightness values, thereby enabling gray-scale expression to be realized. In general, display voltages are set stepwise according to respective decode results of digital signals each of a plurality of bits for gray-scale.

Hence, a display apparatus capable of gray-scale expression requires a decode circuit for decoding a digital signal to recognize a designated gray level. Generally, since in the decode circuit, many transistor switches are necessary for decoding, there has been a task to reduce a scale of the circuit.

In order to solve such a problem, disclosed in Japanese Patent Laying-Open No. 2001-34234 is a configuration of a decode circuit referred to as a so-called "tournament scheme".

In this scheme, disclosed are a configuration of a decode circuit in which n-MOS (Metal Oxide Semiconductor) transistors of N in number are connected serially between each of nodes on which 2 to the nth power levels (hereinafter, referred to as 2^N) of gray-scale voltages are generated, respectively, and the corresponding one of nodes on which display voltages are generated, respectively, when 2^N gray levels are displayed according to digital signals each of N bits (N is an integer of 2 or more), and a configuration of a decode circuit in which reduction is made in the number of n-MOS transistors connected serially in each transmission path of gray-scale voltages.

In the configuration of a decode circuit shown in FIG. 8 of the above publication, however, a decode circuit area can be down-sized, whereas a necessity arises for a voltage drop caused by a threshold voltage of an n-MOS transistor to be compensated. Hence, a gate voltage of each of n-MOS transistors included in the decode circuit requires to be set higher than a gray-scale voltage to be transmitted by at least the threshold of an n-MOS transistor.

For this reason, an amplitude of a gate voltage is larger, which also makes a noise amplitude larger that can be transmitted through a parasitic capacitance created between a gate electrode of an n-MOS transistor and a source electrode or a drain voltage thereof, thereby causing a problem of an enhanced influence on a display voltage applied to a pixel.

In a decode circuit shown in FIG. 9 of the above publication, reduction is made in the number of n-MOS transistors included in each transmission path of gray-scale voltages, thereby enabling a drop of a gray-scale voltage to be suppressed. On the other side, since increase is required in the number of transistors required in the decode circuit as a whole, a problem arises in respect of down-sizing and a production yield of the circuit.

SUMMARY OF THE INVENTION

It is an object of the present invention to provide a display apparatus capable of presenting a gray-scale expression and provided with a decode circuit, suppressing increase in circuit area, and high in noise resistance.

A display apparatus according to the present invention is a display apparatus presenting a gray-scale expression according to a digital signal of a plurality of bits, including: a plurality of voltage nodes through which a plurality of gray-scale voltages including a series of levels in a gradual manner are transmitted, respectively; a plurality of first signal lines transmitting the plurality of bits of the digital signal, respectively; a plurality of second signal lines provided along the same direction as the plurality of first signal lines and transmitting inverted signals of the plurality of bits, respectively; a decode circuit selecting one of the plurality of gray-scale voltages according to the digital signal to output a selected gray-scale voltage among the plurality of gray-scale voltages to an output node as a display voltage; and pixels each for displaying a brightness value corresponding to the display voltage selected by the decode circuit, wherein the decode circuit includes a plurality of decode paths formed so as to intersect the first and second signal lines between the plurality of voltage nodes and the output node, each of the plurality of decode paths include a plurality of field effect transistors corresponding to the plurality of bits of the digital signal, the plurality of field effect transistors are disposed along a direction intersecting the first and second signal lines and connected serially between the output node and a corresponding voltage node of the plurality of voltage nodes each of the gates of the plurality of field effect transistors is connected to one signal line of the first and second signal lines transmitting the corresponding bit and the inverted signal of the corresponding bit, respectively, and in each of the plurality of field effect transistors, a capacitance is formed between the other signal line not connected to the gate of the first and second signal lines and a node to which the source or drain thereof is connected electrically. In one decode path selected according to the digital signal among the plurality of decode paths, the plurality of field effect transistors are all turned on and, in each of the other decode paths, at least one of the plurality of field effect transistors is turned off.

A main advantage of the present invention is in that in the decode paths for transmitting gray-scale voltages, noises opposite in phase which cancel each other from the first and second signal lines are superimposed with respect to each bit of a display signal. Accordingly, noise resistance in a decode circuit can be enhanced and a gray-scale voltage can be set with high precision without increasing the number of decode transistors. Therefore, a display quality of a display apparatus can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Detailed description will be given of an embodiment of the present invention below with reference to the accompanying drawings. Note that the same symbols in the figures indicate the same as or corresponding constituents.

Figure 1:
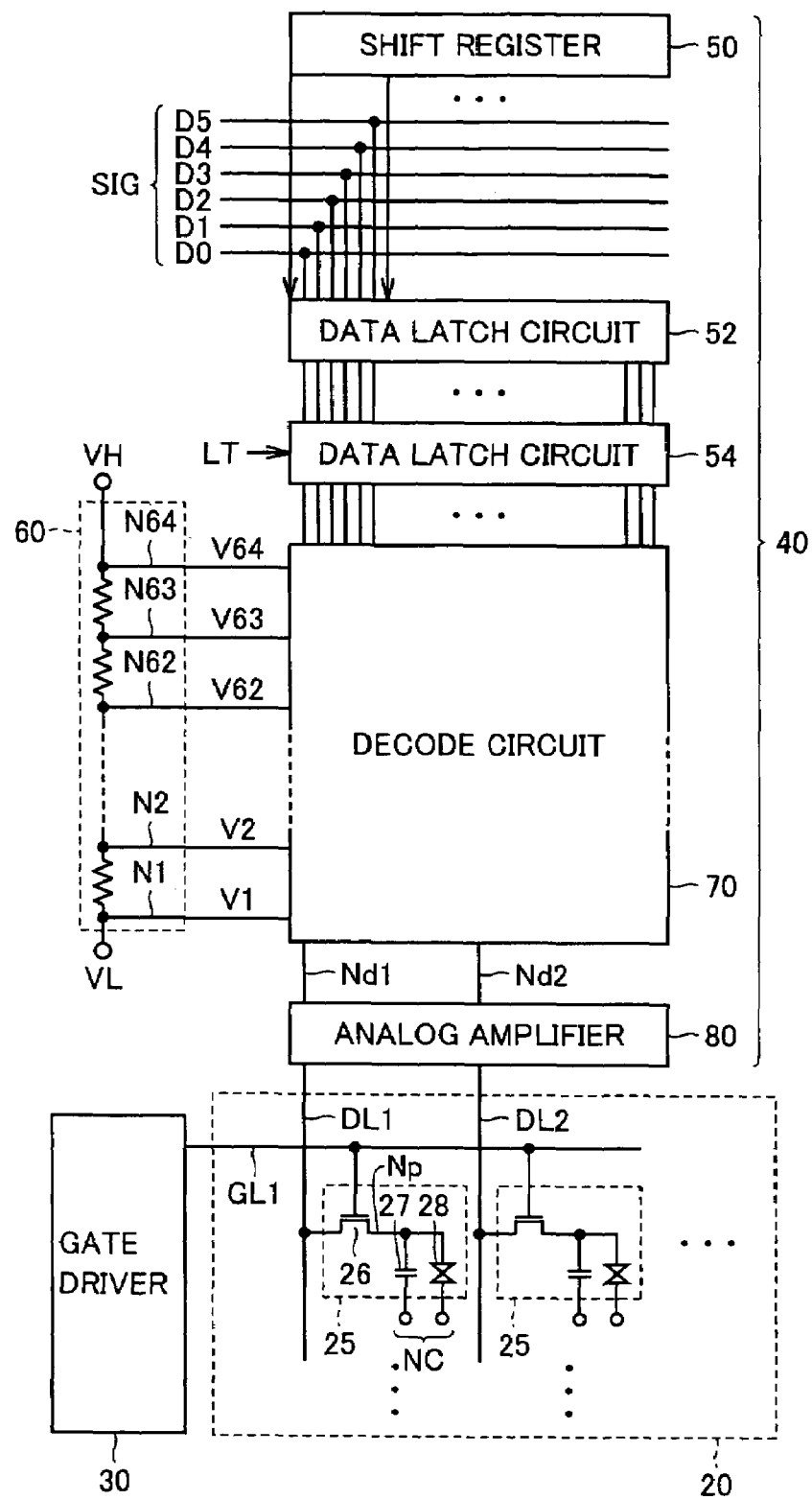
FIG. 1 is a block diagram showing an overall configuration of a liquid crystal display apparatus as a typical example of a display apparatus according to an embodiment of the present invention.

FIG. 1 is a block diagram showing an overall configuration of a liquid crystal display apparatus 10 as a typical example of a display apparatus according to an embodiment of the present invention.

With reference to FIG. 1, liquid crystal display apparatus 10 according to the embodiment of the present invention includes a liquid crystal array section 20, a gate driver 30 and a source driver 40.

Liquid crystal section 20 includes a plurality of pixels 25 arranged in a matrix. Gate lines GL are provided corresponding to respective rows of pixels (hereinafter also referred to as "pixel rows") and data lines DL are provided corresponding to respective columns of pixels (hereinafter also referred to as "pixel columns"). In FIG. 1, there are typically shown pixels of a first column and a second column on a first row and, corresponding to them a gate line GL1 and data lines DL1 and DL2, respectively.

Each pixel 25 includes: a pixel switching element 26 provided between corresponding data line DL and a pixel node Np; and a storage capacitor 27 and a liquid display element 28 connected in parallel between pixel node Np and a common electrode Nc. An orientation order of liquid crystal in liquid crystal display element 28 alters according to a voltage difference between pixel node Np and common electrode node Nc, and a display brightness of liquid crystal display element 28 alters in response to the alteration in orientation order. In such a way, a brightness value of each pixel can be controlled according to a display voltage transmitted to pixel node Np through data line DL and pixel switching element 26. Pixel switching element 26 is, for example, constituted of an n-type field effect transistor.

That is, an intermediate voltage difference between a voltage difference corresponding to the maximum brightness and a voltage difference corresponding to the minimum brightness is applied between pixel node Np and common electrode node Nc, thereby enabling an intermediate brightness. That is, display voltages are stepwise set, thereby enabling gray-scale expression.

Gate driver 30 activates gate lines GL sequentially based on a predetermined scanning period. The gate of pixel switch element 26 is connected to corresponding gate line GL. Therefore, pixel node Np is connected to corresponding data line DL during a period when corresponding gate line GL is in an active state at H level. Generally, pixel switching element 26 is constituted of a TFT (Thin-Film Transistor) formed on the same insulating substrate as liquid crystal display element 28 (a glass substrate, a resin substrate or the like). A display voltage transmitted to pixel node Np is held by storage capacitor 27.

Figure 2:
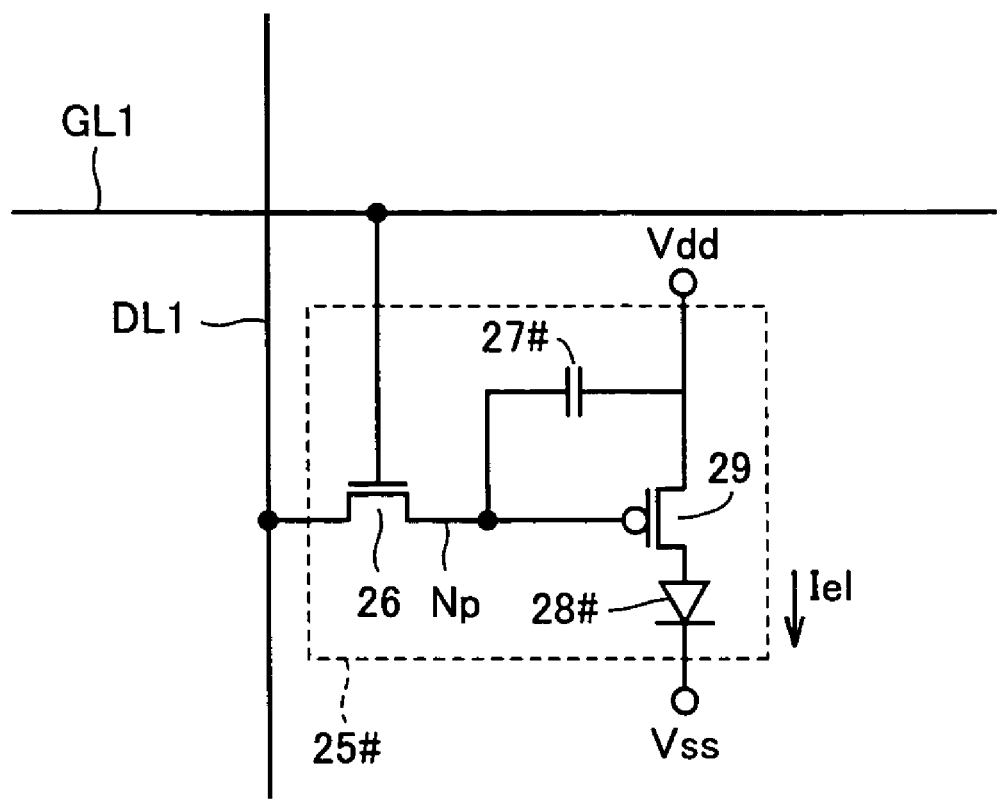
FIG. 2 is a circuit diagram showing a configuration example of a pixel including an EL element.

Alternatively, a pixel including an EL element shown in FIG. 2 can be applied to pixel 25 shown in FIG. 1.

With reference to FIG. 2, a pixel 25# includes pixel switching element 26, a storage capacitor 27#, an EL display element 28# and a current driving transistor 29. Pixel switch element 26 is similar to that in pixel 25, disposed between corresponding data line DL (data line DL1 in the example of FIG. 2, which hereinafter applies to that in the following description) and pixel node Np, and the gate thereof is connected to corresponding gate line GL (gate line GL1 in the example of FIG. 2, which hereinafter applies to that in the following description). Storage capacitor 27# is connected between pixel node Np and a voltage Vdd. EL display element 28# and current driving transistor 29 are connected serially between voltage Vdd and a voltage Vss. Current driving transistor 29 is constituted of, for example, a p-type field effect transistor. Pixel switching element 26 and current driving transistor 29 are generally formed on the same insulating substrate as EL display element 28#.

Pixel switching element 26 connects pixel node Np to data line DL during a period when corresponding gate line GL is in an active state at H level. With this operation, a display voltage on data line DL is transmitted to pixel node Np. A voltage on pixel node Np is held by storage capacitor 27#.

Current driving transistor 29 has the gate connected to pixel node Np to supply a current Iel corresponding to a voltage on pixel node Np to EL display element 28. A display brightness of EL display element 28# alters according to supplied passing current Iel. Therefore, in pixel 25#, display voltages applied to a pixel are stepwise set, thereby enabling brightness values of EL display element to be set with a series of levels in a gradual manner.

As will be clear in the following description, the invention of the present application is directed to a peripheral circuit, especially a configuration of a decode circuit, in a display apparatus capable of presenting an intermediate brightness value according to a display voltage applied to each pixel. Therefore, in a liquid crystal display apparatus shown as an example representative for a display apparatus in the embodiment of the present invention, which will be described below, if pixel 25 including a liquid crystal element is replaced with pixel 25# including an EL element, there can be constructed a display apparatus according to the present invention presenting a display using EL elements using a peripheral circuit with a similar configuration.

Again with reference to FIG. 1, source driver 40 outputs each of display voltages set stepwise to data line DL using display signal SIG, which is a digital signal of N bits. While, in the following description of this embodiment, description is given typically of a case where N=6, that is display signal SIG is constituted of display signal bits D0 to D5, no specific limitation is placed on the number of bits of display signal SIG in application of the invention of the present application and any number of bits can be adopted.

Based on display signal SIG of 6 bits, enabled in each pixel is gray-scale expression including 2^6=64 levels. Furthermore, if one color display unit is formed from a pixel of each of R (Red), G (Green) and B (Blue) in colors, color displays in about 260,000 colors can be realized.

Source driver 40 includes a shift register 50, data latch circuits 52 and 54, a gray-scale voltage generating circuit 60, a decode circuit 70 and an analog amplifier 80.

Display signals SIG are serially generated corresponding to display a brightness value of pixel 25. That is, display signal bits D0 to D5 at each timing exhibit a display brightness value of one pixel of liquid crystal array section 20.

Shift register 50 commands capturing of display signal bits D0 to D5 to a data latch circuit 52 at a timing in synchronism with a predetermined period at which setting of display signal SIG is altered. Data latch circuit 52 captures display signals SIG for one pixel row serially generated to hold them.

At a timing when display signals SIG for one pixel row are captured in data latch circuit 52, the display signal group latched in data latch circuit 52 are transmitted to data latch circuit 54 in response to activation of a latch signal LT.

Gray-scale voltage generating circuit 60 is constructed with 63 voltage dividing resistors connected serially between a high voltage VH and a low voltage VL and 64 gray-scale voltages V1 to V64 are generated on respective voltage nodes N1 to N64. Note that gray-scale voltage generating circuit 60 does not require to be provided in source driver 40 integrally as single circuitry and a configuration can be adopted in which gray-scale voltages V1 to V64 are supplied to voltage nodes N1 to N64 from outside of source driver 40.

Decode circuit 70 decodes a display signal latched in data latch circuit 54 to select gray-scale voltages V1 to V64 based on the decoding. Decode circuit 70 generates a selected gray-scale voltage (one of V1 to V64) on decode output node Nd as a display voltage. In this embodiment, decode circuit 70 outputs display voltages of one pixel row in parallel based on display signals latched in data latch circuit 54. Note that in FIG. 1, there are typically shown decode output nodes Nd1 and Nd2 corresponding to data lines DL1 and DL2 on first and second columns.

Analog amplifier 80 outputs analog voltages corresponding to display voltages outputted onto decode output nodes Nd1, Nd2, . . . to data lines DL1, DL2, . . . .

Note that while in FIG. 1, there is exemplified a configuration of the liquid crystal display device 10 in which gate driver 30 and source driver 40 are integrally formed together with liquid array section 20 in single circuitry, gate driver 30 and source driver 40 can also be provided as external circuits of liquid crystal section 20.

Then, detailed description will be of a configuration of a decode circuit.

Figure 3:
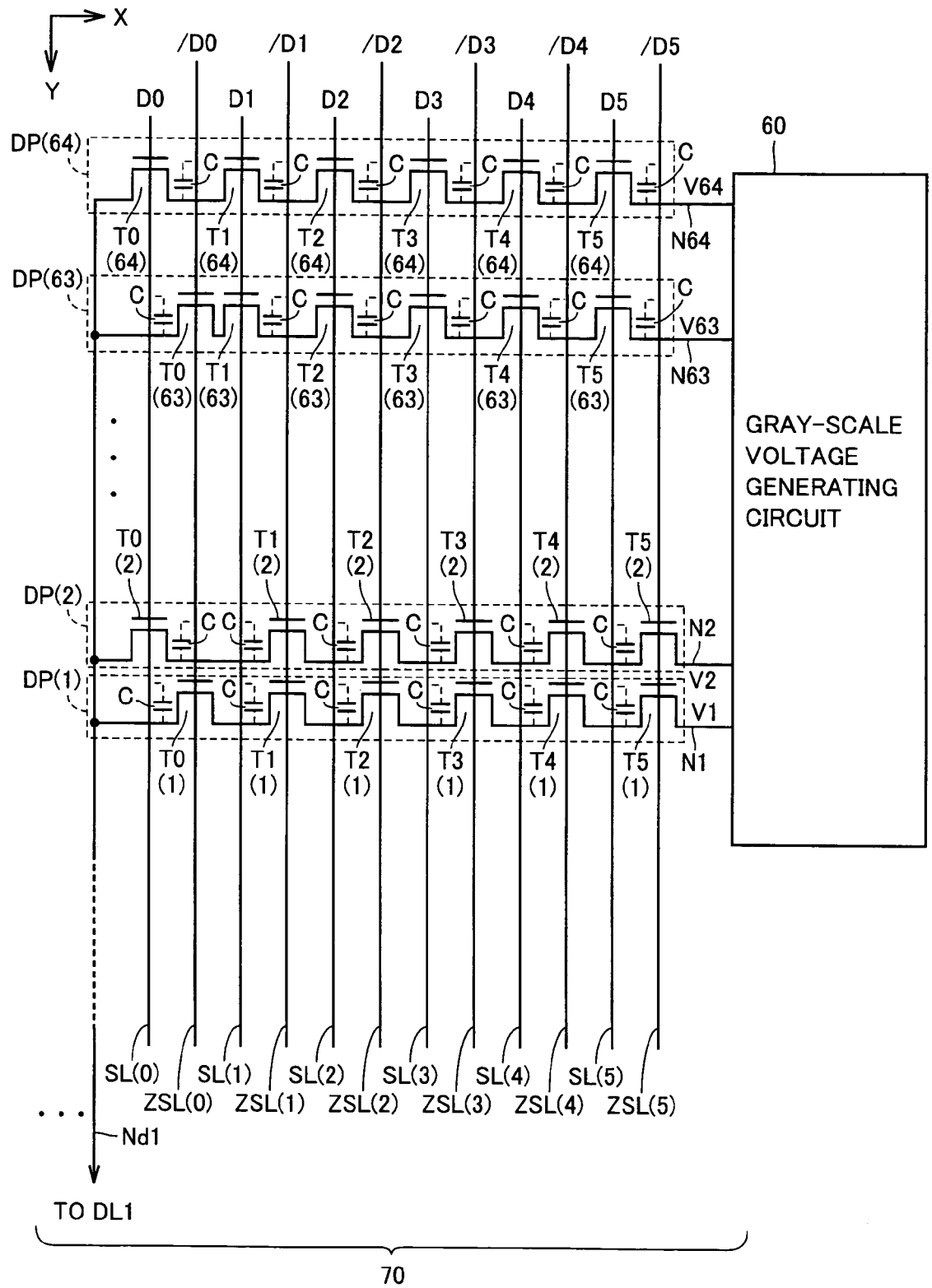
FIG. 3 is a circuit diagram showing a configuration example of a decode circuit according to the embodiment of the present invention.

FIG. 3 is a circuit diagram showing a configuration example of the decode circuit shown in FIG. 1. In FIG. 3, there is typically shown a configuration corresponding to decode output node Nd1. In output node Nd corresponding to data lines DL, a configuration similar to that in FIG. 3, though not shown, is provided.

With reference to FIG. 3, decode circuit 70 includes decode paths DP(1) to DP(64). Decode paths DP(1) to DP(64) are provided in order to transmit gray-scale voltages V1 to V64 to output nodes Nd1 from respective nodes N1 to N64. In FIG. 3, there are typically shown decode paths DP(1), DP(2), DP(63) and DP(64) corresponding to gray-scale voltages V1, V2, V63 and V64. Decode paths configured in a similar manner, though not shown, are also disposed for gray-scale voltages V3 to V62.

In a region where decode circuit 70 is disposed, there are provided signal lines SL(0) to SL(5) transmitting respective display signal bits D0 to D5 and signal lines ZSL(0) to ZSL(5) transmitting respective signals opposite in phase display signals D0 to D5, that is inverted bits /D0 to /D5, disposed in the same direction (Y direction).

Description will be collectively given as follows: in decode path DP(i) of the i-th (i is an integer from 0 to 64), decode transistors T0(i) to T5(i) in serial connection corresponding to respective display signal bits D0 to D5 are arranged between node Ni and output node Nd1 in X direction. The gate of decode transistor T0(i) is connected to one of signal line SL(0) and ZSL(0), the gate of decode transistor T1(i) is connected to one of signal line SL(1) and ZSL(1) and the gate of decode transistor T2(i) is connected to one of signal line SL(2) and ZSL(2). Similarly, the gate of decode transistor T3(i) is connected to one of signal line SL(3) and ZSL(3), the gate of decode transistor T4(i) is connected to one of signal line SL(4) and ZSL(4) and the gate of decode transistor T5(i) is connected to one of signal line SL(5) and ZSL(5). In application of the invention of the present application, a decode transistor is constituted of a field effect transistor. In this embodiment, it is assumed that a decode transistor is typically constituted of an n-type thin film transistor (TFT).

Connection, here, of decode transistors T0(i) to T5(i) to signal lines SL (which is a collective expression of SL(0) to SL(5), which applies hereinafter in the following description) and signal lines ZSL (which is a collective expression of ZSL(0) to ZSL(5), which applies hereinafter in the following description) is determined so that voltage nodes N1 to N64 are connected electrically to output node Nd1 sequentially in correspondence with increments in display signal bits D0 to D5 with display signal bit D0 as the lowest bit.

For example, decode path DP(64) is disposed in a direction (X direction) intersecting signal lines SL and ZSL, including decode transistors T0(64) to T5(64) connected serially between voltage node N64 and decode output node Nd1. The gates of decode transistor T0(64) to T5(64) are connected to respective signal lines SL(0) to SL(5). Therefore, when display signal bits (D0, D1, D2, D3, D4, D5)=(1, 1, 1, 1, 1, 1), decode transistors T0(64) to T5(64) in decode path DP(64) are all turned on to thereby connect voltage node N64 electrically to decode output node Nd1. With this operation, decode path DP(64) is selectively formed among all decode paths to selectively output gray-scale voltage V64 to output node Nd1.

Similarly, decode circuit DP(63) is disposed along X direction, including decode transistors T0(63) to T5(63) connected serially between voltage node N63 and decode output node Nd1. The gate of decode transistor T0(63) is connected to signal line ZSL(0) and the gates of decode transistors T1(63) to T5(63) are connected to the respective signal lines SL(1) to SL(5). Therefore, when display signal bits (D0, D1, D2, D3, D4, D5)=(0, 1, 1, 1, 1, 1), decode transistors T0(63) to T5(63) in decode path DP(63) are all turned on and voltage node N63 is connected electrically to decode output node Nd1. With this operation, decode path DP(63) is selectively formed among all decode paths to selectively output gray-scale voltage V63 to output node Nd1.

Decode path DP(2) is disposed along X direction, including decode transistors T0(2) to T5(2) connected serially between voltage node N2 and decode output node Nd1. The gate of decode transistor T0(2) is connected to signal line SL(0) and the gates of decode transistors T1(2) to T5(2) are connected to respective signal lines ZSL(1) to ZSL(5). Therefore, when display signal bits (D0, D1, D2, D3, D4, D5)=(1, 0, 0, 0, 0, 0), decode transistors T0(2) to T5(2) in decode path DP(2) are all turned on and voltage node N2 is connected electrically to decode output node Nd1. With this operation, decode path DP(2) is selectively formed among all decode paths to selectively output gray-scale voltage V2 to output node Nd1.

Similarly, decode circuit DP(1) is disposed along X direction, including decode transistors T0(1) to T5(1) connected serially between voltage node N1 and decode output node Nd1. The gates of decode transistors T0(1) to T5(1) are connected to the signal lines ZSL(1) to ZSL(5). Therefore, when display signal bits (D0, D1, D2, D3, D4, D5)=(0, 0, 0, 0, 0, 0), decode transistors T0(1) to T5(1) in decode path DP(2) are all turned on and voltage node N1 is connected electrically to decode output node Nd1. With this operation, decode path DP(1) is selected among all decode paths to selectively output gray-scale voltage V1 to output mode Nd1.

In such a way, in decode circuit 70, decode transistors are independently provided to each of decode paths DP (which is a collective expression of decode paths DP(1) to DP(64)) and each decode transistor is not shared by decode paths DP. Therefore, the number of decode transistors disposed are a product obtained by multiplying the number of bits of a display signal by the number of gray-scale voltages.

With such a construction adopted, one decode path is selected corresponding to display signal bits D0 to D5 and in the selected decode path, the decode transistors are all turned on. On the other hand, in each of the other decode paths, at least one decode transistor is turned off. Therefore, decode circuit 70 selectively outputs one of gray-scale voltages V1 to V64 as a display voltage in correspondence with 64 combinations of display signal bits D0 to D5 with display signal bit D0 as the lowest bit to output node Nd1.

As described above, each of the gates of decode transistors in decode circuit 70 is connected to corresponding one of one lines of signal lines SL and signal lines ZSL. Therefore, a gate capacitance is created between one signal line and each of decode paths DP. If with formation of the gate capacitance resulted, a display signal bit transmitted through the one signal line changes from H level to L level or vice versa, the alteration in voltage is superimposed on a transmitted gray-scale voltage as noise by capacitance coupling based on the gate capacitance.

In the invention of the present application, the other signal lines not connected to the gate of the decoded transistor are disposed so as to create parasitic capacitance C between a node connected electrically to the source or drain of the decode transistor. Since an alteration in voltage opposite in phase to the one signal line is generated in the other signal lines, the alteration in voltage is further superimposed on decode path DP through which the gray-scale voltage is transmitted by capacitance coupling based on the parasitic capacitance C.

In such a way, noises opposite in phase canceling each other are superimposed in each of decode transistors from the one and the other of signal lines SL, ZSK. Accordingly, in the selected decode path, there can be suppressed a noise interfering with a gray-scale voltage (a display voltage) caused by alteration in display bits D0 to D5. With the result of suppression of a noise, a precision in setting a gray-scale voltage is improved, thereby enabling a display quality to be improved through performing a correct gray-scale expression.

Then, detailed description will be given of a configuration of a decode circuit according to this embodiment capable of suppressing a noise as described above.

Figure 4:
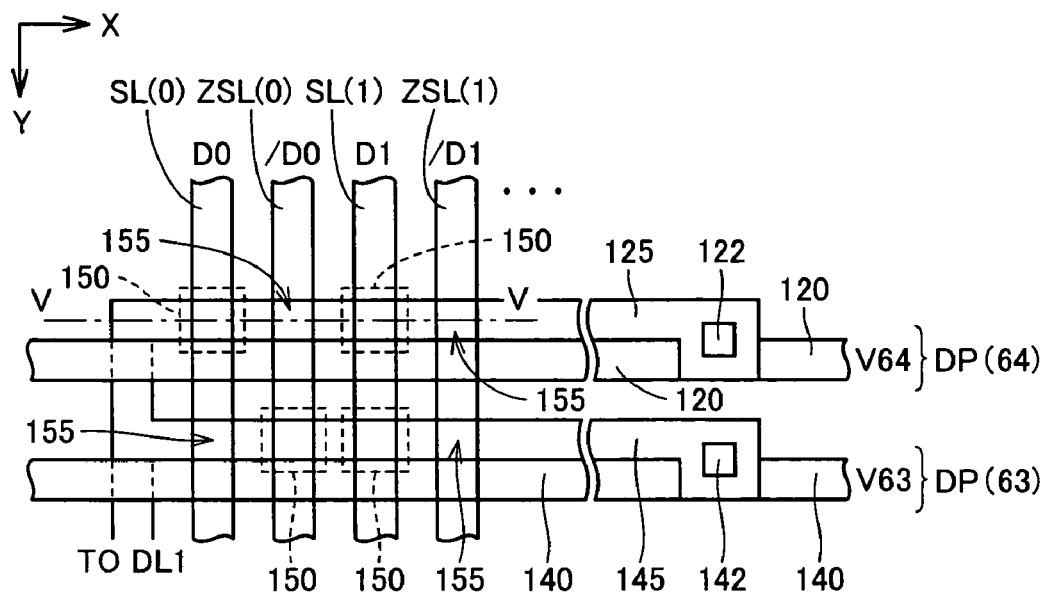
FIG. 4 is a plan view describing a detailed configuration of the decode circuit shown in FIG. 3.

FIG. 4 is a plan view describing a detailed configuration of the decode circuit according to this embodiment. In FIG. 4, there is typically shown a detailed configuration of a portion corresponding to gray-scale voltages V63 and V64, and signal bits D0 and D1 of the decode circuit shown in FIG. 3.

With reference to FIG. 4, a wire 120 corresponding to voltage node N64 for transmitting a gray-scale voltage V64 is provided along X direction in corresponding to decode path DP(64). The wire 120 is typically formed with a metal material and commonly owned by a construction corresponding to another data line not shown.

A polysilicon wire 125 formed in a continuous shape along X direction is provided as a semiconductor wire for forming decode transistors. The polysilicon wire 125 is made of a layer different from the wire 120 and serves as a transmission path (that is, a part of decode path DP) for a gray-scale voltage. Polysilicon wires 125 corresponding to data lines DL are necessary to be isolated electrically from each other. The polysilicon wire 125 shown in the figure is connected electrically to data line DL1 at a node (not shown) and connected electrically to wire 120 via a contact 122.

Signal lines SL(0), ZSL(0), SL(1), ZSL(1), . . . are further disposed along Y direction. The signal lines are made typically of chromium as gate wires of the decode transistors.

In order to realize a configuration of the decode circuit shown in FIG. 3, there arises a necessity to selectively form intersecting sections 150 where a decode transistor is formed, at intersecting sections of each of signal lines SL(0), ZSL(0), SL(1), ZSL(1), . . . with polysilicon wires 125, while discriminating intersecting sections 155 where no decode transistor is formed from an intersecting sections with a decode transistor.

To be concrete, there arises a necessity that, in decode path DP(64), intersecting sections 150 are set so that decode transistors are formed at intersections of signal lines SL(0) and SL(1) with polysilicon wire 125, while intersecting section 155 are set so that no decode transistor is formed at intersections of signal lines ZSL(0) and ZSL(1) with polysilicon wire 125.

Figure 5:
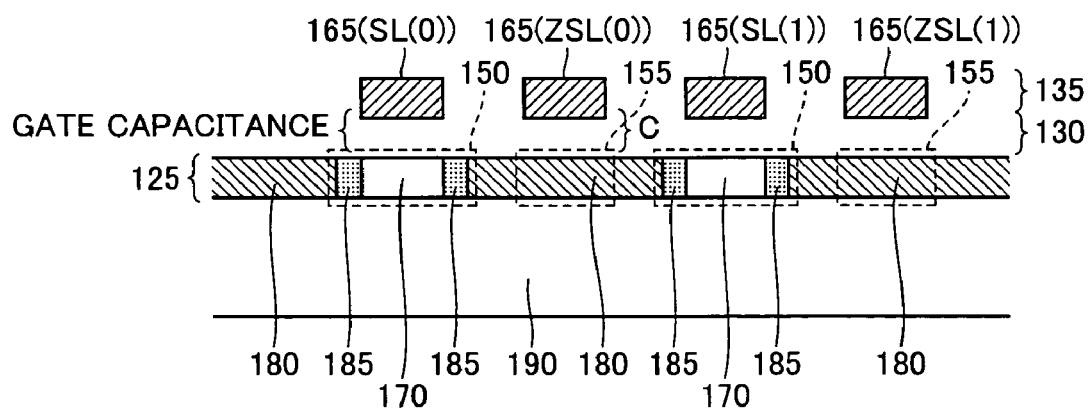
FIG. 5 is a sectional view taken along line V-V in FIG. 4.

FIG. 5 is a sectional view taken along line V-V in FIG. 4 for detailed description of structures of intersecting sections 150 and 155.

With reference to FIG. 5, polysilicon wire 125 is formed on a substrate 190 made of an insulating material such as glass, resin or the like. Gate wires 165 corresponding to signal lines SL(0), ZSL(0), SL(1), ZSL(1), . . . are formed using a metal wiring layer 135 with gate insulating film 130 sandwiched between the metal wiring layer 135 and polysilicon wire 125.

At intersecting section 155, an n-type region 180 is formed in polysilicon wire 125 in a region right below gate wire 165 with gate insulating film 130 sandwiched between metal wiring layer 135 and polysilicon wire 125, that is a region which the gate wire 165 intersects in a top plan view. N-type region 180 is implanted with a n-type impurity (for example, phosphorus ion) at a high concentration so as to be electrically conductive at all times independently of a voltage on corresponding gate wire 165. Therefore, no field effect transistor is formed at intersecting section 155 and the section serves as a conductor at all times regardless of a voltage on corresponding gate wire 165.

On the other hand, at intersecting section 150, a plain region 170 into which an n-type impurity is not implanted is left in a region right below gate wire region 165 with gate insulating film 130 is sandwiched between metal wiring layer 135 and polysilicon wire 125, that is a region which the gate wire 165 intersects in a top plan view. LDD (Light-Doped-Drain) regions 185 are provided so as to sandwich plain region 170 between n-type regions 180 serving as the source and drain, respectively. With such a construction adopted, a channel is formed or not formed in plain region 170 of intersecting section 150 according to a voltage on corresponding gate wire 165. That is, a field effect transistor (more specifically, TFT) corresponding to a decode transistor is formed at intersecting section 150. Note that since a drain electric field is alleviated in the presence of LDD regions 185, a withstand voltage of n-type TFT is improved.

In such a way, in each of intersecting sections 150 and 155, a capacitance in the same laminate structure is formed between gate wire 165 and polysilicon wire 125 with gate insulating film 130 interposed therebetween. Therefore, a capacitance value of parasitic capacitance C can be substantially the same as a capacitance value of a gate capacitance. Consequently, noises opposite in phase each other are caused to act as described in FIG. 3, thereby enabling interference of a noise with a gray-scale voltage transmitted by decode transistors to be suppressed.

Note that even in a case where gate wire 165 is continuously formed in the same layer, intersecting section 150 in which a field effect transistor is formed or intersecting section 155 in which no field effect transistor is formed can be selectively formed according to whether or not an impurity is implanted into polysilicon wire 125, which is a semiconductor layer. Hence, a construction of decode circuit 70 can be more compact in height and horizontal directions.

Again with reference to FIG. 4, intersecting sections 150 are provided at intersections of remaining signal lines SL(2) to SL(5) with polysilicon wire 125. On the other hand, intersecting sections 155 are provided at intersections of signal. Lines ZSL(2) to ZSL(5) with polysilicon wire 125.

A wire 140 and a polysilicon wire 145 disposed along X direction are provided in similar ways to those of metal wire 120 and polysilicon wire 125 in correspondence to decode path DP (63). A contact 142 is provided in a similar way to that of contact 122 in order to connect wire 140 and polysilicon wire 145 electrically to each other. There arises a necessity that, in decode path DP(63), intersecting sections 150 are set so that decode transistors are formed at intersections of signal lines ZSL(0) and SL(1) with polysilicon wire 125, while intersecting sections 155 are set so that no decode transistor is formed at intersections of signal lines SL(0) and ZSL(1) with polysilicon wire 125. Such a necessity can be achieved, as shown in FIG. 5, by selecting how to form an impurity implanting pattern on polysilicon wire 125.

Though not shown in the figure, wires corresponding to wires 120 and 140, and polysilicon wires 125 and 145 are also formed continuously in other decode paths and by selectively forming intersecting section 150 or 155, the configuration shown in FIG. 3 can be realized in a similar way.

A decode circuit according to this embodiment, as described below, can be fabricated in parallel in the same fabrication process on the same insulating substrate (a glass substrate and a resin substrate) as pixels 25 in FIG. 1. Consequently, there can be realized down-sizing and reduction in fabrication cost of a display apparatus.

Figure 6:
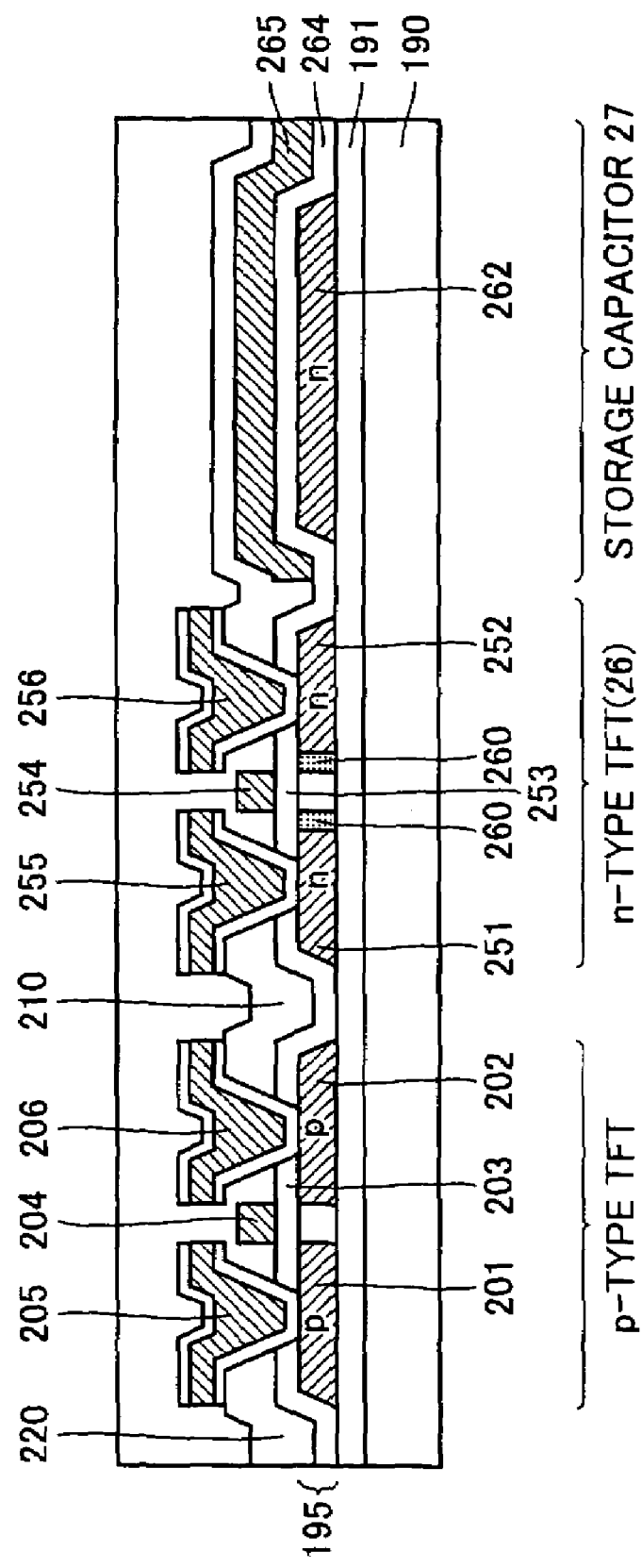
FIG. 6 is a view describing a structure of a pixel portion shown in FIG. 1.

FIG. 6 is a view describing a structure of pixel 25 shown in FIG. 1.

With reference to FIG. 6, an n-type TFT provided as pixel switching element 26 in pixel 25 (which is hereinafter referred to as n-type TFT 26) is fabricated using a semiconductor film 195 such as polysilicon formed on an insulating substrate 190. An insulating film 191 may be provided between insulating substrate 190 and semiconductor film 195.

N-type TFT 26 includes: source/drain regions 251 and 252 formed by impurity implantation with an n-type impurity on a semiconductor film 195; a gate 254 provided in a wiring layer with a gate insulating film 253 such as $SiO_2$ or the like interposed between the wiring layer and semiconductor film 195; and electrodes 255 and 256 secured in electrical contact with source/drain regions 251 and 252. LDD regions 260 are provided between source/drain regions 251 and 252 to cause increase in withstand voltage of n-type TFT due to alleviation of a drain electric field. Provided to gate 254 is a gate wire corresponding to gate line GL shown in FIG. 1 extending in a predetermined direction.

Note that a p-type TFT can be fabricated using the same layer as an n-type TFT 26. P-type TFT is formed using semiconductor film 195, having source/drain regions 201 and 202 into which a p-type impurity is implanted, gate 204 and electrodes 205 and 206 secured in electrical contact with respective source/drain regions 201 and 202. An gate insulating film 203 made of the same material and in the same layer as a gate insulating film 253 is provided between semiconductor film 195 and gate 204. TFTs are isolated electrically by element isolating films 210 and 220 made from an insulator.

Electrodes 205 and 206, and 255 and 256 corresponding to the sources and drains of TFTs are fabricated generally from aluminum, while gate wires provided to gates 204 and 254 are made from chromium or the like.

Storage capacitor 27 in pixel 25 has n-type region 262 formed by implanting n-type impurity into semiconductor film 195 and metal electrode 265 formed in the same layer as gate wires (gates 204 and 254) as one electrode and the other electrode, respectively. Since insulating film 264 provided in the same layer as gate insulating film 253 is formed between the one electrode and the other electrode, a capacitance is formed there. In a section not shown in the figure, n-type region 262 corresponding to one electrode 262 is connected electrically to electrode 256. Electrode 256 corresponds to pixel node Np shown in FIG. 1.

Polysilicon wire 125 of decode circuit 70 shown in FIG. 5 can be fabricated in the same process from the same material as semiconductor film 195 of a pixel portion shown in FIG. 6 and a decode transistor formed in intersecting section 150 can be fabricated in a similar way to that of n-type TFT 26. Gate insulating film 130 and gate wire 165 shown in FIG. 5 as well can be fabricated in the same processes from the same materials as gate insulating film 253 and the gate wire corresponding to gate 254 shown in FIG. 6. Furthermore, a structure of intersecting section 155 in which one and the other electrodes are constructed with gate wire 165 and n-type region 180 is similar to the structure of storage capacitor 27. Therefore, impurity implantation for forming n-type region 180 can be executed in the same process as n-type region 262 of storage capacitor 27.

Figure 7:
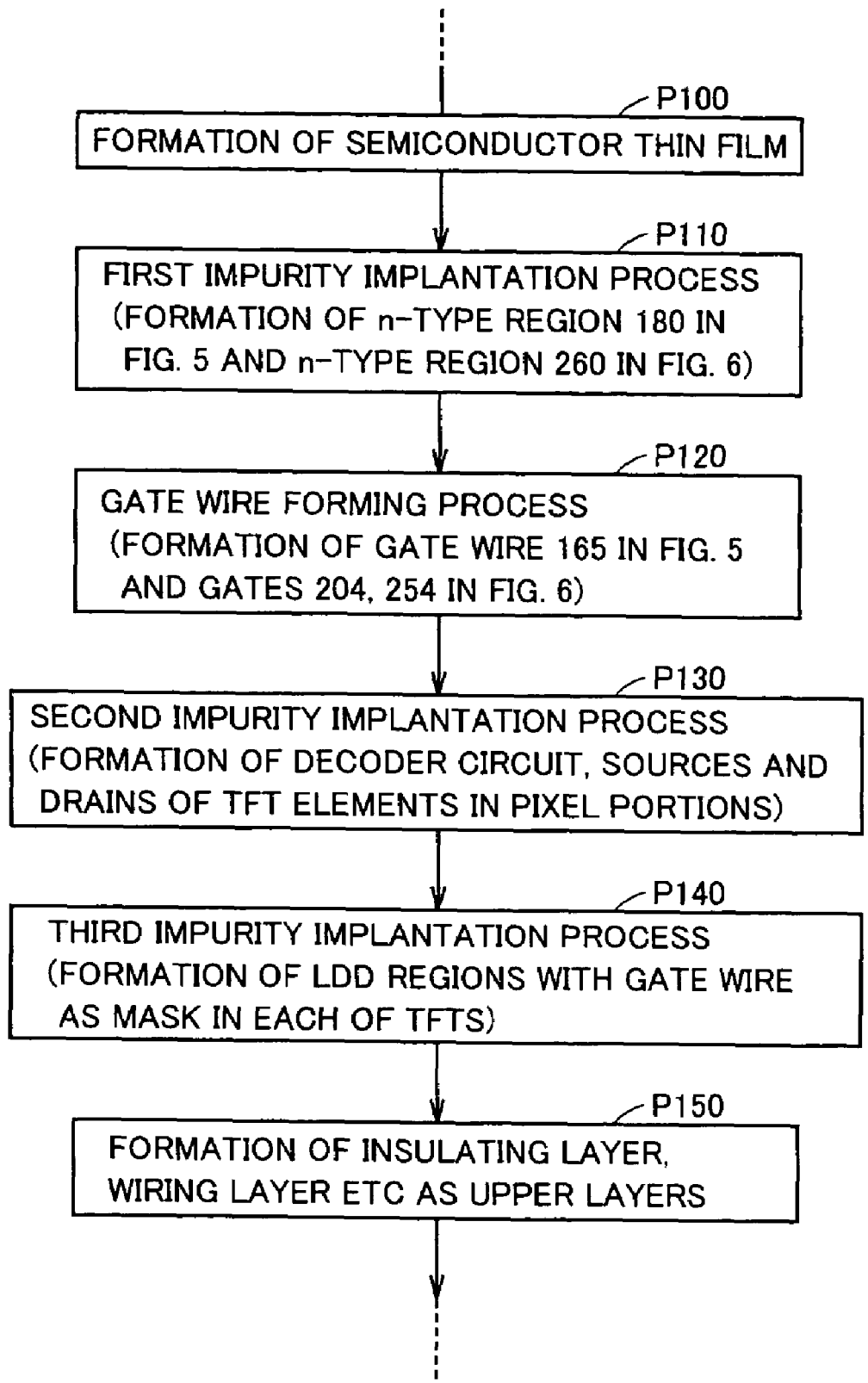
FIG. 7 is a flowchart describing a fabrication process for the decode circuit shown in FIGS. 3 to 5.

FIG. 7 is a flowchart describing a fabrication process for the decode circuit according to this embodiment of the present invention.

Constituents of the decode circuit of the structure shown in FIG. 5 are fabricated in parallel in a fabrication process for pixels shown in FIG. 6. A pixel structure shown in FIG. 6 can be fabricated by a common process; therefore, a fabrication process of the decode circuit is shown only by what process each constituent is fabricated in and detailed description of each process will not be given.

With reference to FIG. 7, in a process of forming a semiconductor thin film on an insulating substrate (process P100), polysilicon wire 125 in a decode circuit portion and a semiconductor film 195 in a pixel portion are formed in parallel to each other.

Then, a first impurity implantation process (process P110) is conducted. Prior to process P110, a mask is formed in a region corresponding to intersecting section 150 on polysilicon wire 125 in a decode circuit portion and a mask is formed in a region where a TFT is formed in a pixel portion. Therefore, in process P110, impurity implantation (doping with phosphorus ion or the like) at a relative high concentration is conducted except the regions. Formed by the impurity implantation are n-type region 180 (corresponding to intersecting section 155) in FIG. 5 and n-type region 262 (corresponding to storage capacitor 27) in FIG. 6.

Then, the resist is removed and thereafter, a gate wire forming process (process P120) is performed. Formed in parallel in process 120 are gate insulating film 130 shown in FIG. 5 and gate insulating films 203 and 253 shown in FIG. 6. Then, in parallel conducted are formation of gate wire 165 (FIG. 5) on gate insulating film 130 and formation of gate wires corresponding to gate line GL shown in FIG. 1 (gates 204 and 254 shown in FIG. 6). Gate wires are typically formed with chromium wires.

After process P120 ends, there is formed a resist with a line width wider than a gate line formed and thereafter, a second impurity implantation process (process P130) is conducted with the resist as a mask. With this process, formed in parallel are n-type regions 180 corresponding to the source/drain regions of TFT (a decode transistor) formed at intersecting section 150 shown in FIG. 5 and source/drain regions 251 and 252 of n-type TFT 26 shown in FIG. 6.

At the end point of process P130, each TFT corresponding to a decode transistor or a pixel switching element has an n-type area except LDD regions 185 and 260.

Then, the resist is removed and thereafter, a third impurity implantation process (process P140) is conducted with a gate wire as a mask by means of self-alignment. An ion concentration doped in process P140 is lower than those in the first and second impurity implantation processes (processes P110 and P130) to thereby form in parallel LDD regions 185 and 260 in TFTs in a decode circuit portion and TFTs in a pixel portion.

According to processes P100 to P140 described above, the decode circuit portion shown in FIG. 5 can be fabricated in parallel to fabrication processes for a pixel structure shown FIG. 6. Thereafter, an insulating layer and wiring layer as the upper layers are sequentially formed to thereby fabricate other circuit portions of a display apparatus.

While exemplified in this embodiment is a structure in each TFT in which gate wire (or polysilicon wire) is provided in the upper layer side of a semiconductor layer, it is also possible to use an inverted structure in which upper and lower layers are interchanged therebetween to provide a semiconductor film (or a polysilicon wire) in the upper layer side of the gate wire. In the latter case, as well, if TFTs in a pixel portion and TFTs in a decode circuit portion are matched with each other in a relation of an upper layer and lower layer therein actually disposed.

While in FIG. 3, description is given of the configuration in which decode transistors in each decode path are independently disposed, part of the decode transistors can be shared among a plurality of decode paths in order to reduce the number of decode transistors disposed.

Figure 8:
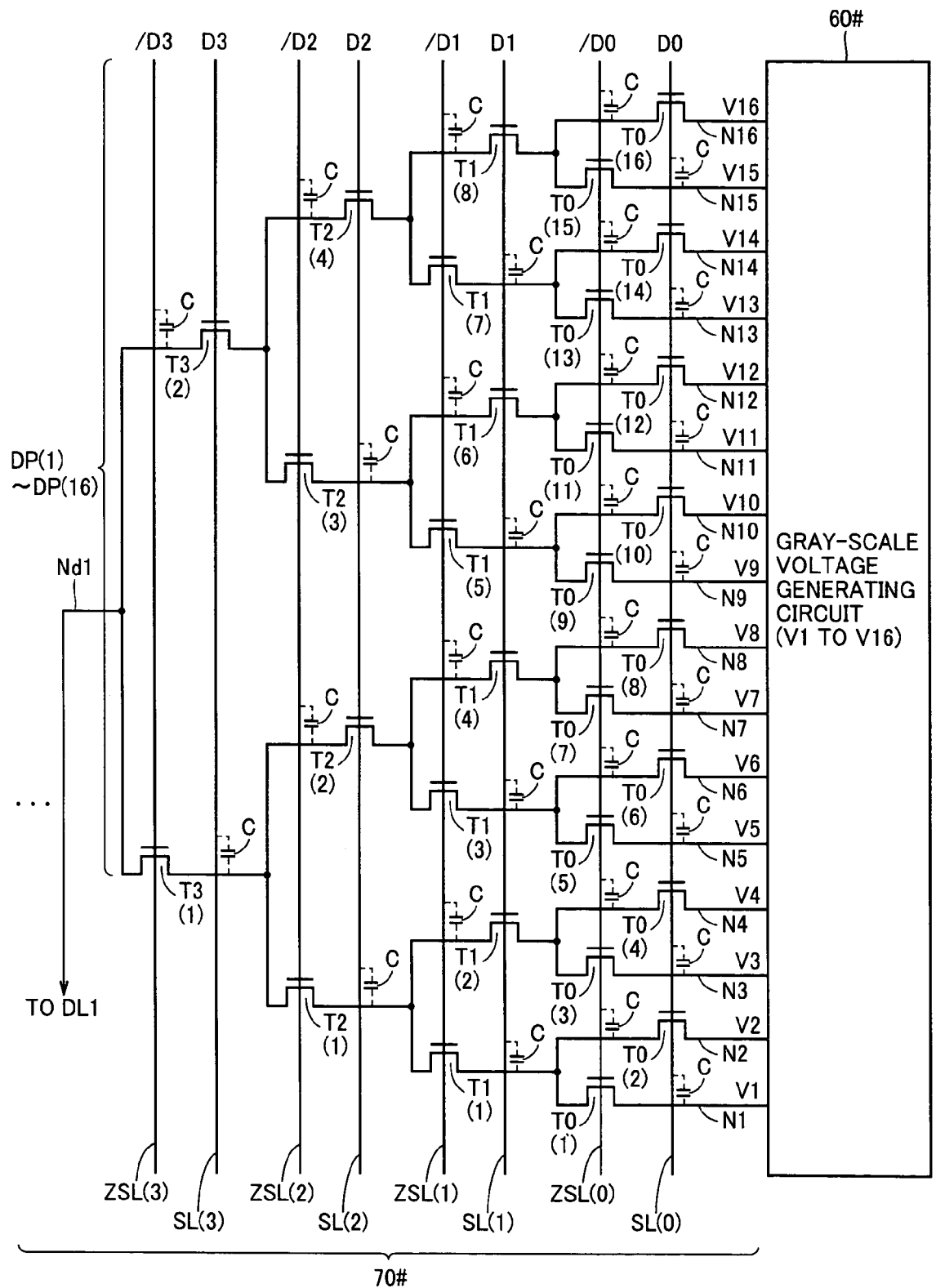
FIG. 8 is a circuit diagram showing another configuration example of a decode circuit according to the embodiment of the present invention.

FIG. 8 is a circuit diagram showing another configuration example of the decode circuit according to the embodiment of the present invention.

With reference to FIG. 8, a gray-scale voltage generating circuit 60# as a replacement of gray-scale voltage generating circuit 60 in FIG. 3 generates gray-scale voltages V1 to V16 at 16 levels. A decode circuit 70# according to another example configuration decodes a display signal of 4 bits constituted of display signals D0 to D3 to selectively output one of gray-scale voltages V1 to V16 from gray-scale voltage generating circuit 60# to output node Nd based on the decoding.

Decode circuit 70# includes decode paths DP(1) to DP(16). Decode paths DP(1) to DP(16) are provided to transmit gray-scale voltages V1 to V16 to output node Nd1 from respective nodes N1 to N16.

In decode circuit 70#, decode transistors corresponding to the other display signal bits D1 to D3 except the lowest display signal bit D0 are shared by the plurality of decode paths.

To be concrete, decode transistors T0(1) to T0(16) corresponding display signal bit D0 are provided to respective decode paths DP(1) to DP(16), while decode transistor T3(1) corresponding to display signal bit D3 is shared by decode paths DP(1) to DP(8) and decode transistor T3(2) is shared by decode paths DP(9) to DP(16).

Each of decode transistors T2(1) to T2(4) corresponding to display signal bit D2 are, in a similar way, shared by four adjacent decode paths DP as a set in a similar way. That is, decode transistors T2(1) and T2(2) are shared by a set of decode paths DP(1) to DP(4) and a set of decode paths DP(5) to DP(8), respectively, and decode transistors T2(3) and T2(4) are shared by a set of decode paths DP(9) to DP(12) and a set of decode paths DP(13) to DP(16), respectively. Each of decode transistors T1(1) to T1(8) corresponding to display signal bit D1 is shared by a pair of two adjacent decode paths.

In a similar way to that in FIG. 3, provided along Y direction are signal lines SL(0) to SL(3) through which display signal bits D0 to D3 are transmitted, respectively, and signal lines ZSL(0) to ZSL(3) through which signals opposite in phase display signal bits D0 to D3, that is inverted bits /D0 to /D3 are transmitted, respectively. The gates of decode transistors are connected to one of corresponding signal lines SL and ZSL, alternately.

Decode path DP(16), for example, includes decode transistors T0(16), T1 (8), T2(4) and T3(2) having the gates connected to respective signal line SL(0) to SL(3). Therefore, when display signal bits (D0, D1, D2, D3)=(1, 1, 1, 1), decode path DP(16) is selected among all the decode paths to output a gray-scale voltage V16 to output node Nd1.

Decode path DP(15), in a similar way, includes decode transistors T0(15), T1(8), T2(4) and T3(2) having the gates connected to respective signal line ZSL(0), SL(1) to SL(3). Therefore, when display signal bits (D0, D1, D2, D3)=(0, 1, 1, 1), decode path DP(15) is selected among all the decode paths to output a gray-scale voltage V15 to output node Nd1.

Decode path DP(2) includes decode transistors T0(2), T1(1), T2(1) and T3(1) having the gates connected to respective signal line SL(0), ZSL(1) to ZSL(3). Therefore, when display signal bits (D0, D1, D2, D3)=(1, 0, 0, 0), decode path DP(2) is selected among all the decode paths to output a gray-scale voltage V2 to output node Nd1.

Decode path DP(1), in a similar way, includes decode transistors T0(1), T1(1), T2(1) and T3(1) having the gates connected to respective signal line ZSL(0) to ZSL(3). Therefore, when display signal bits (D0, D1, D2, D3)=(0, 0, 0, 0), decode path DP(1) is selected among all the decode paths to output a gray-scale voltage V1 to output node Nd1.

In other decode paths, a configuration is, in a similar way, adopted in which voltage nodes N1 to N16 are sequentially connected electrically to output node Nd1 according to increments of display signal bits D0 to D3 with display signal bit D0 as the lowest bit.

With such a configuration adopted, one decode path is selected according to a display signal of a plurality of bits and in the selected decode path, the decode transistors are all turned on. On the other hand, in each of the other decode paths, at least one of the decode transistors is turned off.

Therefore, decode circuit 70# shown in FIG. 8, though having decode transistors smaller in number than the decode circuit shown in FIG. 3, can selectively output a gray-scale voltage as a display voltage to output node Nd1 according to display signal bits with display signal bit D0 as the lowest bit.

Parasitic capacitance C, in a similar way to that of decode circuit 70 shown in FIG. 3, is created between signal lines not connected to the gates of decode transistors and each of decode paths, thereby enabling a noise interfering with a gray-scale voltage (display voltage) caused by alteration in display signal bits D0 to D5 to be suppressed. With such suppression of a noise resulted, a precision in gray-scale voltage setting is improved, thereby enabling a display quality to be improved through a correct gray-scale expression.

Note that while in FIG. 8, there is exemplified the configuration of decode circuit 70# decoding a display signal of 4 bits, another configuration of decode circuitry can be adopted in which decode transistors corresponding to display signal bits except the lowest bit are shared among a plurality of decode circuits.

While in this embodiment, there is exemplified a configuration with decode transistors constituted of n-type TFTs, the decode transistors can be constituted of p-type TFTs. In the latter case, one electrode in n-type region 262 of storage capacitor 27 in pixel 25 shown in FIG. 7 is replaced with that in a p-type region, thereby enabling decode transistors can be fabricated in the same process as the storage capacitor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A display apparatus presenting a gray-scale expression according to a digital signal of a plurality of bits, comprising:
 a plurality of voltage nodes through which a plurality of gray-scale voltages including a series of levels in a gradual manner are transmitted, respectively;
 a plurality of first signal lines transmitting said plurality of bits of said digital signal, respectively;
 a plurality of second signal lines provided along the same direction as said plurality of first signal lines and transmitting inverted signals of said plurality of bits, respectively;
 a decode circuit selecting one of said plurality of gray-level voltages according to said digital signal to output a selected gray-scale voltage among said plurality of gray-scale voltages to an output node as a display voltage; and
 pixels each for displaying a brightness value corresponding to said display voltage selected by said decode circuit, wherein
 said decode circuit includes a plurality of decode paths formed so as to intersect said first and second signal lines between said plurality of voltage nodes and said output node,
 each of said plurality of decode paths include a plurality of field effect transistors corresponding to said plurality of bits of said digital signal,
 said plurality of field effect transistors are connected serially between said output node and a corresponding voltage node of said plurality of voltage node,
 each of the gates of said plurality of field effect transistors is connected to one signal line of said first and second signal lines transmitting the corresponding bit and the inverted signal of the corresponding bit, respectively,
 in each of said plurality of field effect transistors, a capacitance is formed between the other signal line not connected to said gate of said first and second signal lines and a node to which the source or drain thereof is connected electrically, and
 in one decode path selected according to said digital signal among said plurality of decode paths, said plurality of field effect transistors are all turned on and, in each of the other decode paths, at least one of said plurality of field effect transistors is turned off.

2. The display apparatus according to claim 1, wherein a capacitance created by said other signal line has substantially the same capacitance value as a gate capacitance of said field effect transistor.

3. The display apparatus according to claim 1, wherein each of said plurality of decode paths has a semiconductor wire formed continuously so as to intersect said plurality of first lines and said plurality of second lines between said output node and said corresponding voltage node,
 said plurality of first signal lines and said plurality of second signal lines are formed in a wiring layer with an insulating film sandwiched between the wiring layer and said semiconductor wire,
 a first region of said semiconductor wire intersecting said one signal line in a plan view has an impurity concentration at which a channel is formed or not formed according to a voltage on said one signal line, and
 a second region of said semiconductor wire intersecting said other signal line in a plan view has an impurity concentration at which the second region is electrically conductive independently of a voltage on said other signal line.

4. The display apparatus according to claim 3, wherein an impurity concentration in said second region is higher than that in said first region.

5. The display apparatus according to claim 3, wherein a process of implanting an impurity into said second region is performed before a process of forming said first and second signal lines.

6. The display apparatus according to claim 1, wherein each of said pixels includes:
a display element presenting a brightness value corresponding to a voltage on a pixel node;
a voltage storage capacitor storing the voltage on said pixel node; and
a pixel switching element, connected between a node through which a voltage corresponding to said display voltage is transmitted and said pixel node, and turned on in response to a predetermined scanning period.

7. The display apparatus according to claim 6, wherein
each of said switching element and said plurality of field effect transistors is constituted of a thin film transistor, and
said plurality of field effect transistors and said switching element are formed on the same insulating substrate in the same process.

8. The display apparatus according to claim 6, wherein
the capacitance created by said other signal line has a structure similar to that of said voltage storage capacitor.

9. The display apparatus according to claim 1, wherein each of said pixels includes:
a display element presenting a brightness value corresponding to a passing current;
a pixel switching element, connected between a node through which a voltage corresponding to said display voltage is transmitted and a pixel node, turned on in response to a predetermined scanning period, and constituted of a thin film transistor;
a voltage storage capacitor storing the voltage on said pixel node; and
a current driving element, constituted of a thin film transistor, and supplying a current corresponding to the voltage on said pixel node to said display element.

10. The display apparatus according to claim 9, wherein
the capacitance created by said other signal line has a structure similar to that of said voltage storage capacitor.

11. The display apparatus according to claim 1, wherein
in each of said plurality of decode paths, said plurality of field effect transistors are independently provided.

12. The display apparatus according to claim 1, wherein
part of said plurality of field effect transistors corresponding to the lowest bit of said plurality of bits is independently provided in each of said plurality of decode paths, and
the rest of said plurality of field effect transistors are connected to at least two of said plurality of decode paths.

* * * * *